United States Patent
Liu et al.

(10) Patent No.: US 9,671,470 B2
(45) Date of Patent: Jun. 6, 2017

(54) METHOD AND DEVICE FOR MONITORING ENERGY EFFICIENCY PERFORMANCE OF EQUIPMENT

(75) Inventors: Mingming Liu, Shenzhen (CN); Yanni Meng, Shenzhen (CN); Lingqiao Teng, Shenzhen (CN); Baohang Zhou, Shenzhen (CN); Shuwang Wei, Shenzhen (CN)

(73) Assignee: ZTE CORPORATION, Shenzhen, Guangdong Province (CN)

( * ) Notice: Subject to any disclaimer, the term of this patent is extended or adjusted under 35 U.S.C. 154(b) by 611 days.

(21) Appl. No.: 13/580,792

(22) PCT Filed: Sep. 3, 2010

(86) PCT No.: PCT/CN2010/076627
§ 371 (c)(1),
(2), (4) Date: Aug. 23, 2012

(87) PCT Pub. No.: WO2011/150606
PCT Pub. Date: Dec. 8, 2011

(65) Prior Publication Data
US 2012/0316806 A1     Dec. 13, 2012

(30) Foreign Application Priority Data
Jun. 4, 2010  (CN) .......................... 2010 1 0194666

(51) Int. Cl.
*G01R 31/40*   (2014.01)
*G05B 23/02*   (2006.01)
*G01R 31/00*   (2006.01)

(52) U.S. Cl.
CPC .............. *G01R 31/40* (2013.01); *G01R 31/00* (2013.01); *G05B 23/0235* (2013.01)

(58) Field of Classification Search
CPC ..... G05B 23/0235; G01R 31/40; G01R 31/00
(Continued)

(56) References Cited

U.S. PATENT DOCUMENTS 4,179,921 A * 12/1979 Cook .................. F24H 9/20
                                                  73/113.01
5,374,973 A    12/1994 Maxham et al.
(Continued)

FOREIGN PATENT DOCUMENTS

CN      101689050 A     3/2010
EP       2221949 A1     8/2010
(Continued)

OTHER PUBLICATIONS

International Search Report for PCT/CN2010/076627.
(Continued)

*Primary Examiner* — John Breene
*Assistant Examiner* — Eyob Hagos
(74) *Attorney, Agent, or Firm* — McClure, Qualey & Rodack, LLP

(57) ABSTRACT

The present invention discloses a method for monitoring energy efficiency performance of a device, which comprises: connecting the monitored device, obtaining input energy and output energy of the monitored device in a period of time, and calculating an energy efficiency index of the monitored device; and obtaining an energy efficiency deviation based on a standard energy efficiency index of the monitored device, and determining a state of the monitored device based on the energy efficiency deviation. The present invention further discloses a apparatus for monitoring energy efficiency performance of a device. Using the method and apparatus described above, the fine assessment for the device performance can be implemented in a simple way.

4 Claims, 1 Drawing Sheet

(58) Field of Classification Search
USPC .......................................................... 702/60
See application file for complete search history.

(56) References Cited

U.S. PATENT DOCUMENTS

| | | | |
|---|---|---|---|
| 5,583,413 A | 12/1996 | Proctor et al. | |
| 2001/0034582 A1* | 10/2001 | Umezawa ............ | G05B 23/024 |
| | | | 702/136 |
| 2002/0088241 A1* | 7/2002 | Suitou .................... | F04B 49/02 |
| | | | 62/228.4 |
| 2005/0207949 A1* | 9/2005 | Hasegawa ................. | 422/186.3 |
| 2005/0289489 A1* | 12/2005 | Kim et al. ........................ | 716/4 |
| 2007/0056185 A1* | 3/2007 | Isono ............................. | 34/493 |
| 2008/0209925 A1* | 9/2008 | Pham ............................. | 62/126 |
| 2009/0012673 A1 | 1/2009 | Hori et al. | |
| 2009/0157529 A1 | 6/2009 | Ehlers et al. | |
| 2009/0231152 A1* | 9/2009 | Tung et al. .................... | 340/660 |
| 2010/0138159 A1* | 6/2010 | Conquergood et al. .......... | 702/9 |

FOREIGN PATENT DOCUMENTS

| | | | |
|---|---|---|---|
| JP | 58124971 A | 7/1983 | |
| JP | 2004119231 A | 4/2004 | |
| SU | 1559296 A1 | 4/1990 | |
| WO | 2008148075 A1 | 12/2008 | |
| WO | 2009058880 A2 | 5/2009 | |
| WO | 2009078167 A1 | 6/2009 | |

OTHER PUBLICATIONS

English Abstract of SU1559296 (Published Apr. 23, 1990).
EP Search Report dated Jun. 24, 2016 in EP application No. 10852401.8.

\* cited by examiner

METHOD AND DEVICE FOR MONITORING ENERGY EFFICIENCY PERFORMANCE OF EQUIPMENT

CROSS REFERENCE RELATED APPLICATIONS

This application is a national phase of PCT/CN2010/076627 filed Sep. 3, 2010, which claims priority to China Application Serial No. 201010194666.7, filed Jun. 4, 2010, both of which are entirely incorporated herein by reference.

TECHNICAL FIELD

The present invention relates to the field of device performance assessment, and more particularly, to a method and apparatus for monitoring energy efficiency performance of a device.

BACKGROUND OF THE RELATED ART

There is no electrical energy in nature that can be directly used. Although natural phenomena, such as thunder and lightning, generate some electrical energy, it is difficult to be used as a power source. Therefore, the electrical energy used by humans is converted from mechanical energy, thermal energy, chemical energy, solar energy and the like. In many cases, such electrical energy converted from the mechanical energy, the thermal energy, the chemical energy and the solar energy is inconsistent with use requirements, thus another conversion is required to convert one form of electrical energy into another form of electrical energy. Energy conversion and energy transfer devices are prevalent in people's daily lives and are widely used.

The electrical energy can be divided into two categories: Alternating Current (AC) and Directing Current (DC), and the energy conversion devices can be divided into four types: AC-AC conversion, AC-DC conversion, DC-AC conversion and DC-DC conversion. The AC-DC conversion and the DC-AC conversion are relatively easy to be understood. For the AC-AC conversion, objects that can be converted include frequency, phase, voltage and current. For the DC-DC conversion, objects that can be converted include voltage and current. Methods for monitoring and assessing performance of an electrical device can be roughly divided into two categories:

One is to monitor whether there is energy output in the device, and based on this, to implement rough management. Advantages of this method are simple principle and convenient monitoring, and its drawback is inability to implement meticulous management of the device.

The other is to monitor information, such as on/off state of an input circuit and output circuit, magnitude of voltage, magnitude of current, temperature level, etc., in real time inside the device by designing an intelligent monitoring unit within the device, and send the related information to the next upper-level intelligent monitoring device to perform meticulous management. The drawback is that the structure of the intelligent monitoring unit is complicated, and the reliability of the intelligent monitoring unit itself is required be solved since the intelligent monitoring unit and the device operate together in relatively harsh environment, such as high temperature, high humidity, strong interference, electrostatic, and the like.

Either the first method or the second method can not give accurate performance assessment for a sub-health state of the monitored device, such as degraded performance and increased loss caused by harsh use environment, material aging and other reasons.

SUMMARY OF THE INVENTION

In view of this, a main object of the present invention is to provide a method and apparatus for monitoring energy efficiency performance of a device so as to solve the problem, based on the law of conservation of energy, that a monitoring unit inside the device is not reliable enough and a complicated structure is required to achieve meticulous management.

In order to achieve the object described above, a technical scheme of the present invention is accomplished as follows.

The present invention provides a method for monitoring energy efficiency performance of a device comprising:

connecting the monitored device, obtaining input energy and output energy of the monitored device in a period of time, and calculating an energy efficiency index of the monitored device; and obtaining an energy efficiency deviation based on a standard energy efficiency index of the monitored device, and determining a state of the monitored device based on the energy efficiency deviation.

The determining the state of the monitored device based on the energy efficiency deviation comprises: determining the state of the monitored device based on a location of the energy efficiency deviation in a preset energy efficiency deviation range.

The state includes a health, sub-health or fault state.

The period of time is one or more complete periods selected based on periodic variations of the energy efficiency of the device.

The standard energy efficiency index is a standard energy efficiency index in an ideal state of the device given by its manufacturer.

The present invention also provides an apparatus for monitoring energy efficiency performance of a device, which is externally connected to the monitored device and comprises an energy monitoring module and an energy efficiency determining module, wherein the energy monitoring module is configured to obtain input energy and output energy of the monitored device in a period of time to send to the energy efficiency determining module; and the energy efficiency determining module is configured to calculate an energy efficiency index of the monitored device, obtain an energy efficiency deviation based on a standard energy efficiency index of the monitored device, and determine a state of the monitored device based on the energy efficiency deviation.

The energy monitoring module comprises an input energy monitoring sub-module and an output energy monitoring sub-module, wherein the input energy monitoring sub-module is configured to obtain the input energy of the monitored device in the period of time to send to the energy efficiency determining module; and the output energy monitoring sub-module is configured to obtain the output energy of the monitored device in the period of time to send to the energy efficiency determining module.

The method and apparatus for monitoring energy efficiency performance of a device in accordance with the present invention first obtain input and output energy of the monitored device in a period of time so as to guarantee that the energy accumulation result is used as a determination basis, thereby eliminating interference caused by instantaneous errors. Furthermore, the energy efficiency index is calculated based on the input and output energy, and then the energy efficiency deviation is obtained based on the standard energy efficiency index, and finally the state of the monitored device is determined based on the energy efficiency deviation range such that performance assessment of the monitored device can be implemented from the perspective of a third party. At the same time, the process of the method in accordance with the present invention is simple to implement and the structure of the apparatus is simple, reliable and has high accuracy.

PREFERRED EMBODIMENTS OF THE PRESENT INVENTION

The technical scheme of the present invention will be further described in detail in conjunction with the accompanying drawings and specific embodiments.

Figure 1:
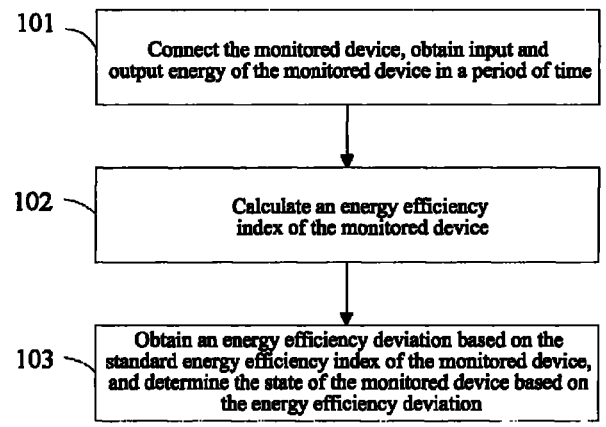
FIG. 1 is a flow chart of a method for monitoring energy efficiency performance of a device in accordance with the present invention.

FIG. 1 is a flow chart of a method for monitoring energy efficiency performance of a device in accordance with the present invention. As shown in FIG. 1, the method for monitoring the energy efficiency performance of the device specifically comprises the following steps.

In step 101, the monitored device is connected, and input and output energy of the monitored device in a period of time is obtained.

Specifically, the method in accordance with the present invention is characterized in that the monitored device is connected externally when monitoring is required. Therefore the monitored device is required to be connected first. The period of time is a selected determination period T, that is, a period from a time point t1 to a time point t2. The length of the selected determination period can be selected according to different features of the monitored device. Normally, if the energy efficiency of the device changes periodically, one or more complete periods are selected as the determination period. For example, the working period of a refrigerator might be selected as a period from the first start of a compressor to the second start of the compressor, or from the first start of the compressor to the third start of the compressor. Therefore, a comprehensive and accurate assessment of the energy efficiency result can be guaranteed.

In a period of time, that is, the period from t1 to t2, the input voltage $u_{in}$ and the input current $i_{in}$ of the monitored device are obtained first, and then the input energy E1 of the monitored device is calculated.

$$E_1 = \int_{t1}^{t2} u_{in}(t) * i_{in}(t) dt$$

Likewise, in the period from t1 to t2, the output voltage $u_{out}$ and the output current $i_{out}$ of the monitored device are obtained first, and then the output energy E2 of the monitored device is calculated:

$$E_2 = \int_{t1}^{t2} u_{out}(t) * i_{out}(t) dt$$

In step 102, an energy efficiency index of the monitored device is calculated.

Specifically, the energy efficiency index is $\eta$:

$$\eta = \frac{E_2}{E_1} * 100\%,$$

where E1 is the input energy, and E2 is the output energy. When the output energy E2 decreases, the energy efficiency index decreases; and when the output energy E2 increases, the energy efficiency index increases.

In step 103, an energy efficiency deviation is obtained based on the standard energy efficiency index of the monitored device, and the state of the monitored device is determined based on the energy efficiency deviation.

Specifically, the standard energy efficiency index $\eta_{rat}$ of the monitored device is provided by its manufacturer. The manufacturer will provide a standard energy efficiency index in an ideal state based on parametric conditions inside the device, such as the process and materials for production of the device. The standard energy efficiency index might be a fixed value, or an energy efficiency curve. The method for calculating the energy efficiency deviation is $\Delta\eta = |\eta - \eta_{rat}|$, where $\Delta\eta$ is the energy efficiency deviation acquired by subtracting the standard energy efficiency index from the practical energy efficiency index.

The determining the state of the monitoring device based on the energy efficiency deviation specifically comprises: determining the state of the monitoring device based on an energy efficiency deviation range given by the manufacturer. The energy efficiency deviation range is provided by the manufacturer according to comprehensive factors, such as the process, materials, product types and use environment for production of the device. Users can also adjust the energy efficiency deviation range according to their own use environments. The energy efficiency deviation range is denoted as $(\Delta\eta_1, \Delta\eta_2)$, where $0 < \Delta\eta_1 < \Delta\eta_2$ The determined standard will be described specifically as follows:

1. If $\Delta\eta \leq \Delta\eta_1$, the performance of the monitored device reaches the standard and the monitored device is in a health state.

2. If $\Delta\eta_1 \leq \Delta\eta \leq \Delta\eta_2$, the energy efficiency index of the monitored device decreases, the energy efficiency deviation increases, the performance is degraded, and the device is in a sub-health state.

3. If $\Delta\eta_2 \leq \Delta\eta$, the energy efficiency index of the monitored device seriously decreases, the energy efficiency deviation significantly increases, and the device is in a fault state.

The method for monitoring the energy efficiency performance of the device in accordance with the present invention will be further described through an example.

In an AC-DC conversion device, input parameters include an input voltage range of 80-300V, a rated input voltage of 220V, and a maximum allowed input current of 18 A, and output parameters include an output voltage range of 42-58V, a rated output voltage of 48V, a maximum output current of 55 A, and a rated output current of 50 A. The operating temperature is −20° C.~+50° C., an energy efficiency index is $\eta_{rat}$=94%, and an energy efficiency deviation range is ($\Delta\eta_1$=3%, $\Delta\eta_2$=5%).

If the collected input energy E1 is 2500 Joules and the output energy E2 is 2325 Joules, then $\eta$ is about 93%, and $\Delta\eta$ is 1%. It can be known from the energy efficiency deviation range that the device is in the health state.

If the collected input energy E1 is 2500 Joules and the output energy E2 is 2250 Joules, then $\eta$ is about 90%, and Δη is 4%. It can be known from the energy efficiency deviation range that the device is in the sub-health state.

If the collected input energy E1 is 2500 Joules and the output energy E2 is 2075 Joules, then η is about 83%, and Δη is 11%. It can be known from the energy efficiency deviation range that the device is in a fault state.

Figure 2:
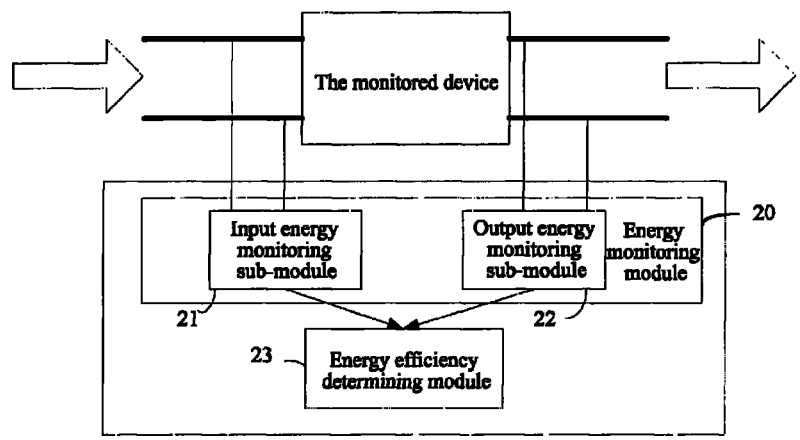
FIG. 2 is a block diagram of an apparatus for monitoring energy efficiency performance of a device in accordance with the present invention.

FIG. 2 is a block diagram of an apparatus for monitoring energy efficiency performance of a device in accordance with the present invention. As shown in FIG. 2, the apparatus is externally connected to the monitored device and comprises an energy monitoring module 20 and an energy efficiency determining module 23.

The energy monitoring module 20 is configured to obtain input energy and output energy of the monitored device in a period of time to send to the energy efficiency determining module 23.

Specifically, the energy monitoring module 20 further comprises an input energy monitoring sub-module 21 and an output energy monitoring sub-module 22.

The input energy monitoring sub-module 21 is configured to obtain the input energy of the monitored device in the period of time to send to the energy efficiency determining module 23.

Specifically, the period of time can be selected according to different features of the monitored device. Normally, if the energy efficiency of the device changes periodically, one or more complete periods are selected as the determination period. For example, the working period of a refrigerator might be selected as a period from the first start of a compressor to the second start of the compressor, or from the first start of the compressor to the third start of the compressor. Therefore, a comprehensive and accurate assessment of the energy efficiency result can be guaranteed.

The output energy monitoring sub-module 22 is configured to obtain the output energy of the monitored device in the period of time to send to the energy efficiency determining module 23.

Specifically, the output energy E2 and the input energy E1 are monitored simultaneously.

The energy efficiency determining module 23 is configured to calculate an energy efficiency index of the monitored device, and obtain an energy efficiency deviation based on a standard energy efficiency index of the monitored device, and determine a state of the monitored device based on the energy efficiency deviation.

Specifically, the energy efficiency index is η:

$$\eta = \frac{E_2}{E_1} * 100\%,$$

where E1 is the input energy, and E2 is the output energy. When the output energy E2 decreases, the energy efficiency index decreases; and when the output energy E2 increases, the energy efficiency index increases. The standard energy efficiency index $\eta_{rat}$ of the monitored device is provided by its manufacturer. The manufacturer will provide a standard energy efficiency index in an ideal state based on parametric conditions inside the device, such as the process and materials for production of the device. The standard energy efficiency index might be a fixed value, or an energy efficiency curve. The method for calculating the energy efficiency deviation is $\Delta\eta = |\eta - \eta_{rat}|$, where Δη is the energy efficiency deviation acquired by subtracting the standard energy efficiency index from the practical energy efficiency index.

The determining the state of the monitoring device based on the energy efficiency deviation specifically comprises: determining the state of the monitoring device based on an energy efficiency deviation range given by the manufacturer. The energy efficiency deviation range is provided by the manufacturer according to comprehensive factors, such as the process, materials, product types and use environment for production of the device. Users can also adjust the energy efficiency deviation range according to their own use environments. The energy efficiency deviation range is denoted as $(\Delta\eta_1, \Delta\eta_2)$, where $0<\Delta\eta_1<\Delta\eta_2$. The determined standard will be described specifically as follows:

1. If $\Delta\eta \leq \Delta\eta_1$, the performance of the monitored device reaches the standard and the monitored device is in a health state.

2. If $\Delta\eta_1 \leq \Delta\eta \leq \Delta\eta_2$, the energy efficiency index of the monitored device decreases, the energy efficiency deviation increases, the performance is degraded, and the device is in a sub-health state.

3. If $\Delta\eta_2 \leq \Delta\eta$, the energy efficiency index of the monitored device seriously reduces, the energy efficiency deviation significantly increases, and the device is in a fault state.

Advantages of the method or apparatus in accordance with the present invention will be described below.

1) The structure of the apparatus in accordance with the present invention is simple and reliable, and has high accuracy.

2) Using the present invention, a determination result can be obtained in a determination period, thus the real-time performance is good.

3) In the present invention, the energy accumulation result is used as a determination basis to eliminate interference caused by instantaneous errors, thus the interference immunity is strong.

4) The apparatus in accordance with the present invention provides performance assessment of the monitored device from the perspective of a third party, and is relatively independent of the monitored device. Whether the performance monitoring apparatus in accordance with the present invention is normal does not influence the normal work of the monitored device, thus the reliability is high.

5) The present invention is adapted to energy conversion and transfer devices of different types, of different manufacturers and of different efficiency levels, and thus has universality in the field of energy conversion and energy transfer.

6) In the present invention, the energy efficiency deviation range is an adjustable factor, which is easy to be adjusted and has good flexibility.

The present invention monitors the energy efficiency index of the device in real time and provides overall assessment of the performance of a device to be monitored, such as the health, sub-health and fault states, and has the following beneficial effects.

1) The faulted device is identified, repaired and replaced, which is helpful to improve stability of the system work.

2) The sub-health state of an energy conversion device is identified, which is helpful to find a device with high energy consumption in advance to commence initiating a spare part plan; the device with high energy consumption is rejected, which is helpful to reduce the device loss, save the operating cost, and protect benefits of investors. Today, as energy shortage is increasingly serious, the present invention is of great significance in energy saving and emission reduction and creating an energy-saving and environment-friendly society.

3) In the field of electrical energy conversion, since the depleted energy is usually converted to thermal energy, early detection of overheating or a potential ignition point can improve safety of the environment in which the device operates and personal safety, increase the reliability of system operation, thus avoiding occurrence of serious incidents such as fire, large-scale power outage and the like, and early warning can be provided to avoid spreading of faults.

The above description is only the preferred embodiments of the present invention and is not intended to limit the protection scope of the present invention. Any modification, equivalent substitution and variation made within the spirit and principle of the present invention should be covered in the protection scope of the present invention.

What is claimed is:

1. A method for monitoring energy efficiency performance of a device comprising:

externally connecting an apparatus for monitoring energy efficiency performance of a monitored device when there is a need of monitoring the energy efficiency performance of the monitored device, externally collecting input energy and output energy of the monitored device in a period of time by the apparatus, calculating an energy efficiency index of the monitored device by the apparatus; wherein the period of time is a selected determination period, the length of which is selected according to different features of the monitored device, and are one or more complete periods if the energy efficiency of the monitored device changes periodically; and obtaining an energy efficiency deviation $\Delta\eta$ based on a standard energy efficiency index of the monitored device by the apparatus, and determining a state of the monitored device based on the energy efficiency deviation $\Delta\eta$ by the apparatus, wherein:

an energy efficiency deviation range is denoted as ($\Delta\eta 1$, $\Delta\eta 2$), where $0<\Delta\eta 1<\Delta\eta 2$, wherein values of $\Delta\eta 1$ and $\Delta\eta 2$ are determined by a manufacturer of the monitored device; determining a state of the monitored device based on the energy efficiency deviation $\Delta\eta$ by the apparatus comprises:

if $\Delta\eta \leq \Delta\eta 1$, determining that the monitored device is in a health state, wherein the monitored device is operating efficiently, if $\Delta\eta 1 \leq \Delta\eta \leq \Delta\eta 2$, determining that the monitored device is in a sub-health state, and initiating repair of the monitored device, if $\Delta\eta 2 \leq \Delta\eta$, determining that the monitored device is in a fault state, and initiating replacement of the monitored device, wherein determining a state of the device means determining overall assessment of performance of the monitored device;

wherein collecting input energy and output energy of the device in a period of time by the apparatus comprising: collecting energy accumulation result in real time by the apparatus;

wherein the apparatus does not influence normal work of the monitored device even if the apparatus does not work normally.

2. The method according to claim 1, wherein the standard energy efficiency index is a standard energy efficiency index in an ideal state of the monitored device.

3. An apparatus for monitoring energy efficiency performance of a device, which is externally connected to a monitored device when there is a need of monitoring the energy efficiency performance of the monitored device and comprises a processor, wherein the processor is configured to externally collect input energy and output energy of the monitored device in a period of time, wherein the processor is further configured to determine the period of time by a selected determination period, the length of which is selected according to different features of the monitored device and is one or more complete periods if the enemy efficiency of the monitored device changes periodically;

calculate an energy efficiency index of the monitored device, obtain an energy efficiency deviation $\Delta\eta$ based on a standard energy efficiency index of the monitored device, and determine a state of the monitored device based on the energy efficiency deviation $\Delta\eta$ as follows:

an energy efficiency deviation range is denoted as ($\Delta\eta 1$, $\Delta\eta 2$), where $0<\Delta\eta 1<\Delta\eta 2$, wherein the processor is further configured to obtain values of $\Delta\eta 1$ and $\Delta\eta 2$ which are determined by a manufacturer of the monitored device; and determine a state of the monitored device based on the energy efficiency deviation $\Delta\eta$ by the apparatus comprises:

if $\Delta\eta \leq \Delta\eta 1$, determining that the monitored device is in a health state, wherein the monitored device is operating efficiently, if $\Delta\eta 1 \leq \Delta\eta \leq \Delta\eta 2$, determining that the monitored device is in a sub-health state, and initiating repair of the monitored device, if $\Delta\eta 2 \leq \Delta\eta$, determining that the monitored device is in a fault state, and initiating replacement of the monitored device, wherein the processor is further configured to determine overall assessment of performance of the monitored device based on the energy efficiency deviation;

wherein the processor is further configured to collect energy accumulation result in real time for the input energy and output energy;

wherein the apparatus does not influence normal work of the monitored device even if the apparatus does not work normally.

4. The apparatus according to claim 3, wherein the standard energy efficiency index is a standard energy efficiency index in an ideal state of the monitored device.

* * * * *